(12) United States Patent
Ilic et al.

(10) Patent No.: US 10,091,891 B2
(45) Date of Patent: Oct. 2, 2018

(54) APPARATUS AND METHOD FOR PRINTING CIRCUITRY

(71) Applicant: VOLTERA INC., Kitchener (CA)

(72) Inventors: Katarina Ilic, Waterloo (CA); Alroy Almeida, Mississauga (CA); James Pickard, St. Catherines (CA); Jesus Zozaya, St. Catherines (CA); Matthew Ewertowski, Brampton (CA)

(73) Assignee: Voltera Inc., Kitchener (CA)

( * ) Notice: Subject to any disclaimer, the term of this patent is extended or adjusted under 35 U.S.C. 154(b) by 0 days.

(21) Appl. No.: 14/795,278

(22) Filed: Jul. 9, 2015

(65) Prior Publication Data
US 2016/0014906 A1    Jan. 14, 2016

Related U.S. Application Data

(60) Provisional application No. 62/023,415, filed on Jul. 11, 2014, provisional application No. 62/113,664, filed on Feb. 9, 2015.

(51) Int. Cl.
| H05K 3/12 | (2006.01) |
| B23K 35/26 | (2006.01) |
| H05K 13/00 | (2006.01) |
| H05K 13/06 | (2006.01) |
| B05C 5/02 | (2006.01) |
| H05K 13/04 | (2006.01) |
| H05K 3/34 | (2006.01) |

(52) U.S. Cl.
CPC .............. *H05K 3/12* (2013.01); *B05C 5/02* (2013.01); *B23K 35/26* (2013.01); *H05K 13/0469* (2013.01); *H05K 3/3478* (2013.01); *H05K 2201/0145* (2013.01); *H05K 2201/0154* (2013.01); *H05K 2203/0126* (2013.01)

(58) Field of Classification Search
None
See application file for complete search history.

(56) References Cited

U.S. PATENT DOCUMENTS

| 3,375,576 | A * | 4/1968 | Driver, Sr. | H05K 3/4092 174/267 |
| 5,060,065 | A * | 10/1991 | Wasserman | G01N 21/8806 348/126 |
| 5,156,772 | A * | 10/1992 | Allan | H01B 1/22 252/512 |
| 2006/0288932 | A1* | 12/2006 | Mori | H05K 3/125 118/313 |
| 2013/0199386 | A1* | 8/2013 | Lynch | B41F 15/0881 101/123 |

* cited by examiner

*Primary Examiner* — Jethro M Pence
(74) *Attorney, Agent, or Firm* — Bereskin & Parr LLP; James W. Hinton

(57) ABSTRACT

The present disclosure provides a novel apparatus and method for printing circuitry that can dispense conducting traces, insulating traces, solder paste, and other materials onto a substrate material in a manner that allows for convenient prototyping of printed circuit boards.

20 Claims, 9 Drawing Sheets

MODE A

MODE B

APPARATUS AND METHOD FOR PRINTING CIRCUITRY

PRIORITY

The present disclosure claims priority from U.S. provisional patent application 62/023,415 filed Jul. 11, 2014, the contents of which incorporated herein by reference, and U.S. provisional patent application 62/113,664 filed Feb. 9, 2015 the contents of which incorporated herein by reference.

FIELD

The present disclosure relates generally to an apparatus and method for printing. More specifically, the present disclosure relates to a method and apparatus which can be used for printing circuitry having electrical functionality.

BACKGROUND

Circuit board prototyping is a factor in hardware development. When designing hardware, the developer can go through several iterations of circuit board designs before finalizing their circuit board and having it mass manufactured. Hardware developers may outsource their circuit board designs, while paying large fees and waiting on long lead times, or fabricating the boards in-house, that can utilize dangerous and corrosive chemicals.

Beyond prototyping, mainstream circuit board patterning can be largely a subtractive process. In order to produce conductive patterns, a subtractive process can employ a chemical etching process whereby conductive material is removed from a single side, or both sides of a copper-clad base material. Holes, known as vias, used for component leads or for an electrical connection spanning from one conductive layer to another, can be provided using a Computer Numerical Control (CNC) drilling process. In the case of a via, the patterned and drilled board passes through a chemical plating process to form the electrical connection between layers.

As circuit designs and miniaturization requirements become more complex, two sides of a copper clad base material may be insufficient for such complex circuit designs. In these circuit boards, created by the subtractive process outlined above, several circuit patterns can be stacked and compressed into a single board to create multilayer circuitry. Stacked circuit boards commonly have in excess of sixteen stacked conductive layers, each separated by the base material. Each conductive layer in the final circuit board can significantly increase the setup and production costs as well as increasing the time to produce the circuit board.

Although chemical etching is a commonly used subtractive process for circuit board fabrication, the overall process can be time consuming, costly, and dangerous to the fabricator as it employs chemicals that can be very toxic and corrosive.

Other subtractive methods have been developed in an attempt to solve the problem of slow and dangerous circuit board prototyping, early on in the hardware development cycle. Isolation routing, for example, does not use chemicals to create the circuit boards but instead uses a computer guided drill bit to remove unwanted copper from a copper-clad base material. With limited setup and fast production times, this subtractive milling process is targeted towards in-house prototyping. However, this process may not be ideal for at least two reasons. First, it is generally limited to rigid substrates and can only produce single or dual sided boards. Second, routing of the copper-clad base can be noisy and can produce dust particles that are a harmful to the lungs.

Additive processes for fabricating circuit boards have drawn attention in the field of rapid prototyping. Unlike subtractive processes, additive techniques can offer the advantage of being virtually unrestricted in layer count due to the fact that material is used as it is needed. Furthermore, since material is added and not removed, there is generally less waste than within subtractive processes. Presently, additive manufacturing techniques with respect to conductive patterning on a base material have been primarily focused around inkjet printing. Inkjet printing technologies involve ejecting micro-drops of a printing fluid from an array of micro-nozzles onto a base material. The micro-drops can only be ejected onto the base material in the pattern specified in a digital file. Advantages of inkjet printing include small feature size combined with rapid processing and minimal setup utilizing a straightforward digital input file.

Conductive inks formulated for inkjet applications can include metallic nano-particles suspended in a solvent solution. Once the ink is ejected onto a base material, the solvent is evaporated leaving behind conductive metallic traces. The impedance of the metallic traces can be improved by post-processing methods such as laser sintering, photonic curing, or thermal curing. By alternating conductive and insulating inks as the printing fluids, layered conductive patterns can be created that are separated by insulating patterns to create complex designs.

Inkjet printing technologies can achieve high resolution performance by tightly controlling the ink's rheology and ensuring that the ink is relatively free of contaminants. The micro-nozzles, from which the printing fluid is ejected can be prone to contaminant buildup. This can be particularly true for conductive fluids. As the conductive ink is exposed to air at the nozzle opening, the solvent evaporates and can leave behind metallic residue around the nozzle. This residue can cause the micro-drops to be ejected at sharp angles or can even clog the nozzle entirely.

To combat the effects of residue build up and to maintain proper printing performance, the metallic content of the printing fluid can be kept relatively low at about 10% to about 30% by weight. By lowering the metallic content of the fluid, the amount of metallic content deposited on the base material is also lowered. As a result, the printed traces can lack the sufficient metal content needed for good electrical performance. Consequently, the metal content of the printed traces can be substantially increased by building up the trace thickness. This can be accomplished by repeatedly depositing conductive fluid over the same area to build up trace thickness and hence improve conductivity, as conductivity is a function of cross sectional area. In addition to being afflicted by poor conductivity, the traces formed by inkjet printing can have low melting temperatures, therefore cannot withstand high temperatures employed by popular soldering techniques such as wave, soldering iron, or reflow to attach functional elements onto the circuit board pattern. Further complications with the inkjet method includes the fluidic nature of these conductive inks, which can create problems with the interfacial surface energy between the ink and substrate material. To elaborate, the polarity of the ink solvent can lead to either over-wetting or under-wetting of the substrate material, which in turn can create poorly resolved traces or peeling of the traces after curing.

Another additive circuit board manufacturing method is screen printing, a technique that uses a woven mesh stencil to transfer conductive paste onto the desired printing material. The stencil forms the desired printed circuit pattern such that conductive paste is transferred through the open areas of the stencil and onto the base material to create an identical circuit pattern. A blade or squeegee is scraped across the stencil, forcing conductive paste to be transferred through the woven-mesh openings and onto the imposed printing material. This technique can allow for fine printed features, and is limited by the resolution of the circuit pattern on the stencil.

However, creating a stencil with the desired circuit pattern for screen printing can be expensive and time consuming. Screen printing is typically based on a photolithographic process that first coats a woven mesh screen in a photosensitive emulsion, and allows the emulsion to solidify through a thermal curing process. Next, a transparency with the printed circuit pattern is secured onto the cured emulsion and exposed to UV light. The transparency acts as a mask, such that areas covered by the pattern on the transparency are protected, while the rest of the emulsion is exposed to the UV light. The protected emulsion can then be washed off by chemicals to leave only the negative of the desired circuit pattern in the emulsion. This can act as a mask for the conductive paste that is to be screen printed across the woven mesh. This process of creating a stencil can be used every time a new circuit pattern is designed for printing.

Screen printing can utilize conductive Polymer Thick Film (PTF) pastes for printing a circuit pattern. Unlike conductive inks used in inkjet printing, conductive PTF pastes use higher viscosities and are therefore not primarily made of solvents. Polymeric materials, such as epoxy resin, typically act as the base in which metallic particles are suspended. A conductive PTF paste is typically composed of about 40% to about 98% metallic nano or micro particles, and the remaining about 2% to about 60% is polymeric material and additives. The combination of high solid content and polymeric material usually gives these screen printing pastes much higher viscosities of, for example, about 20 KcP to about 200 KcP. These higher viscosities can allow the pastes to hold their shape once printed which in turn allows fine features to be printed on the desired material. In addition, traces created by conductive PTF pastes are typically much taller than the sub-micron traces printed by inkjet applications. This increased cross-sectional area, along with the high metallic content, can provide improved conductivity and solderability over conductive inks utilized in inkjet printing. Overall it can be understood that in prototyping applications, where new circuit patterns are frequently used, a technique such as screen printing generally lacks practicality due to multiple stencil iterations.

In sum, the prior art techniques for prototyping circuit boards have various deficiencies. Outsourcing production of the circuit board design can come with elevated costs and lead times, while in-house prototyping techniques can be tedious and dangerous. Additive fabrication techniques such as inkjet printing utilize solvent-based conductive inks that can be unreliable and have poor electrical and structural properties. Although conductive PTF pastes used in screen printing applications have shown reasonable conductivity and solderability, the screen printing technique is not generally suitable for iterative circuit board designs, due to an abundant need for stencils.

SUMMARY

It is an aspect of the present disclosure to provide an apparatus for fabricating single or multilayer circuit boards.

It is also an aspect of the present disclosure to provide a method for printing multilayer circuit boards by utilizing conductive polymer thick film (PTF), and insulating pastes in a direct-write printing technique.

This present disclosure provides a printing apparatus which includes: at least one dispensing head, with nozzles, which encase a conductive PTF paste and an insulating polymeric paste, a heated platform, a robust stage to support the heated platform, a dispensing head carriage that moves the dispensing head in the XYZ-directions with respect to the heated platform, a proximity sensor, and a system to apply a substantially downward force within the dispensing head.

Another aspect of the present disclosure provides a method for printing multilayer circuits, which is carried out using the apparatus of the present disclosure. The method includes: placing a printing substrate onto the heated platform, mapping the surface of the printing substrate with the proximity sensor, and printing the designed circuit pattern via direct-write method, which includes applying a substantially downward force within the dispensing head, to dispense the conductive PTF and insulating polymeric pastes, through nozzles, and directly onto the printing substrate. The method can further include: direct-write printing of the conductive PTF and insulating pastes in layers, thermally curing the printed layers via the heated platform, and repeating this cycle of printing and curing until all the relevant layers are printed that form the desired circuit board.

Another aspect of this disclosure provides an apparatus for printing circuitry comprising: a stage; an attachment mechanism for affixing a printed circuit substrate onto the stage; a carriage assembly for holding at least one dispensing head configured to express a flowable printed circuit board material onto the substrate; a motorized mechanism for moving the substrate material in relation to the dispensing head; and a control circuit for receiving instructions representing a circuit pattern pathway for the printed circuit board material on the substrate and configured to activate the motorized mechanism and the dispensing head according to the instructions.

Another aspect of this disclosure provides a flowable printed circuit board material for expressing from a dispensing head movable along a circuit pattern pathway onto a printed circuit substrate, the flowable printed circuit board material. The flowable printed circuit board material can be one of a conductor, an insulator or a solder.

Another aspect of this disclosure provides a method for printing circuitry comprising: receiving at the control circuit instructions representing a circuit pattern pathway; controlling, via the control circuit, a motorized mechanism for moving the substrate in relation to a dispensing head according to the circuit pattern pathway; and, expressing, under control of the control circuit, from the dispensing head, a flowable printed circuit board material onto the substrate along the circuit pattern pathway.

The circuit pattern pathway can be multilayer and in which case the flowable printed circuit board material is a conductor and accordingly the method can further comprise: expressing, from the dispensing head, an insulating flowable printed circuit board material onto the substrate along the circuit pattern pathway to create a multilayer circuit. The insulating material acts as an electrically insulating barrier between layers of electrically conductive the flowable printed circuit board material.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments will now be described, by way of example only, and in relation to the attached figures, in which.

DETAILED DESCRIPTION

Figure 1:
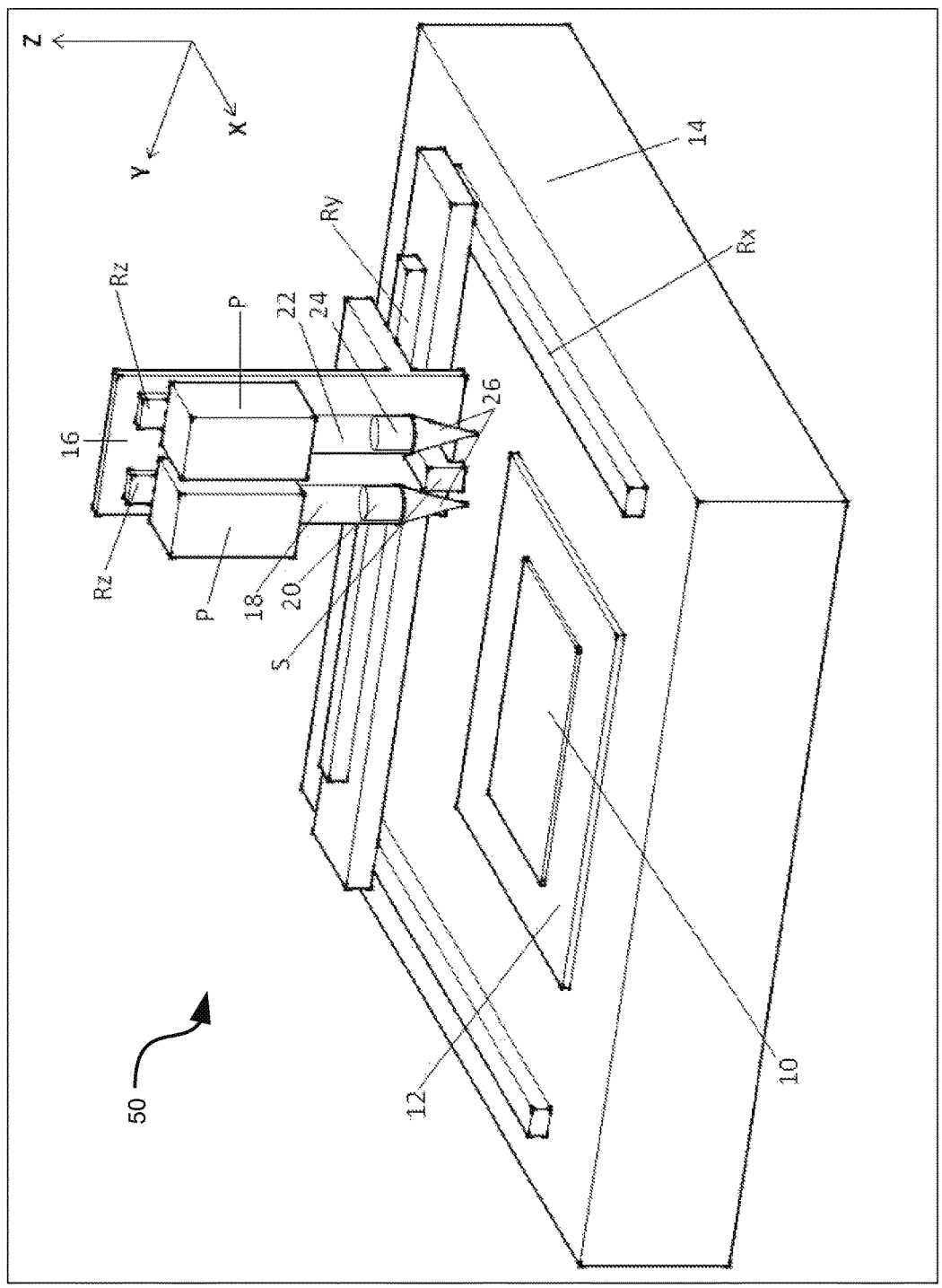
FIG. 1 is a mechanical schematic of the circuit board printing apparatus, in accordance with an embodiment.

FIG. 1 is a mechanical schematic of an apparatus 50 for fabricating single or multilayer circuit boards by a direct-write deposition method, in accordance with an embodiment. The desired circuit board pattern is printed onto a substrate material 10, which can fall into one or more of the categories of: fiberglass, polymer, epoxy, glass, fabrics, ceramic or paper based materials. Such materials can include, but are not limited to: Flame-Retardant 4 (FR-4), Polyimide (PI), Polyethylene Terephthalate (PET), textiles, ceramics such as glass and mica, and any such materials that can be used as a substrate to print rigid and flexible circuitry. The substrate material 10 is secured onto a heated platform 12, which can be capable of reaching temperatures within a range of, for example, about 25° C. to about 400° C. The heated platform 12 can also be capable of producing temperature profiles that sustain a variety of temperatures for specified holding times. Stage 14 holds the heated platform 12 in position and acts as a rigid and robust base for the circuit board printing apparatus 50 of the disclosure.

Apparatus 50 shows that the stage 14 carries a dispensing head carriage 16, which sits above the heated platform 12 and is free to move in the X and Y directions with respect to the heated platform 12 and the substrate material 10. The XY-movement of the dispensing head carriage 16 can be generated by attaching the dispensing head carriage 16 to linear guide rails, Rx and Ry, and driving the movement through motor controls (not shown). The XY-mobile dispensing head carriage 16 holds a first dispensing head 18 and a second dispensing head 22, that function together to print conductive and insulating materials, to form multilayer circuit patterns. The two dispensing heads shown in FIG. 1 are referred to as: dispensing head 18, which encloses conductive PTF paste 20, and dispensing head 22, enclosing insulating polymer paste 24.

Conductive PTF paste 20 and insulating polymer paste 24 are thixotropic materials with viscosities within the ranges of, for example, about 30 KcP to about 200 KcP, or within ranges of about 50 KcP to about 200 KcP.

Conductive PTF pastes can be composed of a metal or ceramic powder mixed with an organic vehicle, and additives, to produce a formulation with a paste like composition. For example, a conductive PTF paste 20, can include, for example, about 30% to about 98% of one or more metallic nano and/or micro solids, such as, but not limited to: Ag, Cu, Al, Ni particles and/or flakes; the remaining portion of the conductive PTF paste 20, can include a combination of organic or polymeric materials, such as: epoxies, Poly (methyl methacrylate) (PMMA), Polyvinylpyrrolidone (PVP), Polyethylene terephthalate (PET), Polyimide (PI), phenol and its derivatives, 2-Pyrrolidone and its derivatives, and the like. By way of non-limiting example, a presently preferred conductive PTF paste comprises about 91.5% of solid silver flakes that fall within about a 1.5 µm to about 9 µm size distribution. The remainder of the composition incorporates under 10% of organic solvents, which includes about 0.5% phenol, as well as methanal, 2-(2-butoxyethoxy) ethyl acetate, and o-cresol. The presently preferred conductive PTF paste has a viscosity within about 90 KcP to about 120 KcP range, with optimal dispensing being achieved at the higher end of the viscosity range. The conductive PTF paste is preferred to be of a thixotropic nature, and includes thermosetting polymers, as those the, for substantially irreversible curing.

Insulating polymer paste 24 can be composed of a combination of insulating polymeric materials, such as: phenol and it's derivatives, epoxies, PMMA, PET, PMMA and the like. A presently preferred insulating polymer paste 24, comprises an epoxy which falls within about 50KcP to about 75 KcP viscosity range. The epoxy is thermosetting and contains about 95-98% non-volatile components.

The dispensing heads 18 and 22 are mobile in the Z-direction, with respect to the platform 12. Similarly, this movement can be motor controlled, and driven through linear guide rails Rz, which can be fixed onto the dispensing head carriage 16. Alternative embodiments can have the entire dispensing carriage 16 on a Z-axis and mobile in the Z-direction to achieve movement of the dispensing heads towards and away the substrate material 10. The dispensing head carriage 16 can in alternative embodiments hold one or more dispensing heads, which can contain materials such as: solder pastes, solder mask materials, silk screen materials and the like, and the embodiment in FIG. 1 shows two dispensing heads for illustrative purposes only. Any of the above mentioned materials which are contained in the dispensing head, such as in dispensing heads 18 and 22, can be referred to as the "enclosed materials" henceforth.

Dispensing heads 18 and 22 of FIG. 1 can include a syringe system which dispenses the enclosed materials, directly onto the substrate material 10, through its respective nozzle 26. The nozzle 26 can have an orifice diameter within a range of, for example, about 1 µm to about 1000 µm. As another example, the diameter can be about 150 µm to about 300 µm. The enclosed materials can be dispensed by applying a substantially downward (along Z-direction) force directly onto the enclosed materials, and toward the substrate material 10. This substantially downward force can be controlled by a controlled displacement system P that can be directly connected to the dispensing heads 18 and 22, containing the enclosed materials. Dispensing heads 18 and 22 can each have their own independently controlled displacement system P. The controlled displacement system P controls the substantially downward force that is applied onto the enclosed materials. In the embodiment of FIG. 1, this can be accomplished by providing a system to control the displacement of a plunger, within dispensing heads 18 and 22, so that the plunger applies a substantially downward force on the enclosed materials. The same can be accomplished through alternative means of applying a substantially downward force on the enclosed materials, such as pressurized gas, and the like.

Figure 2:
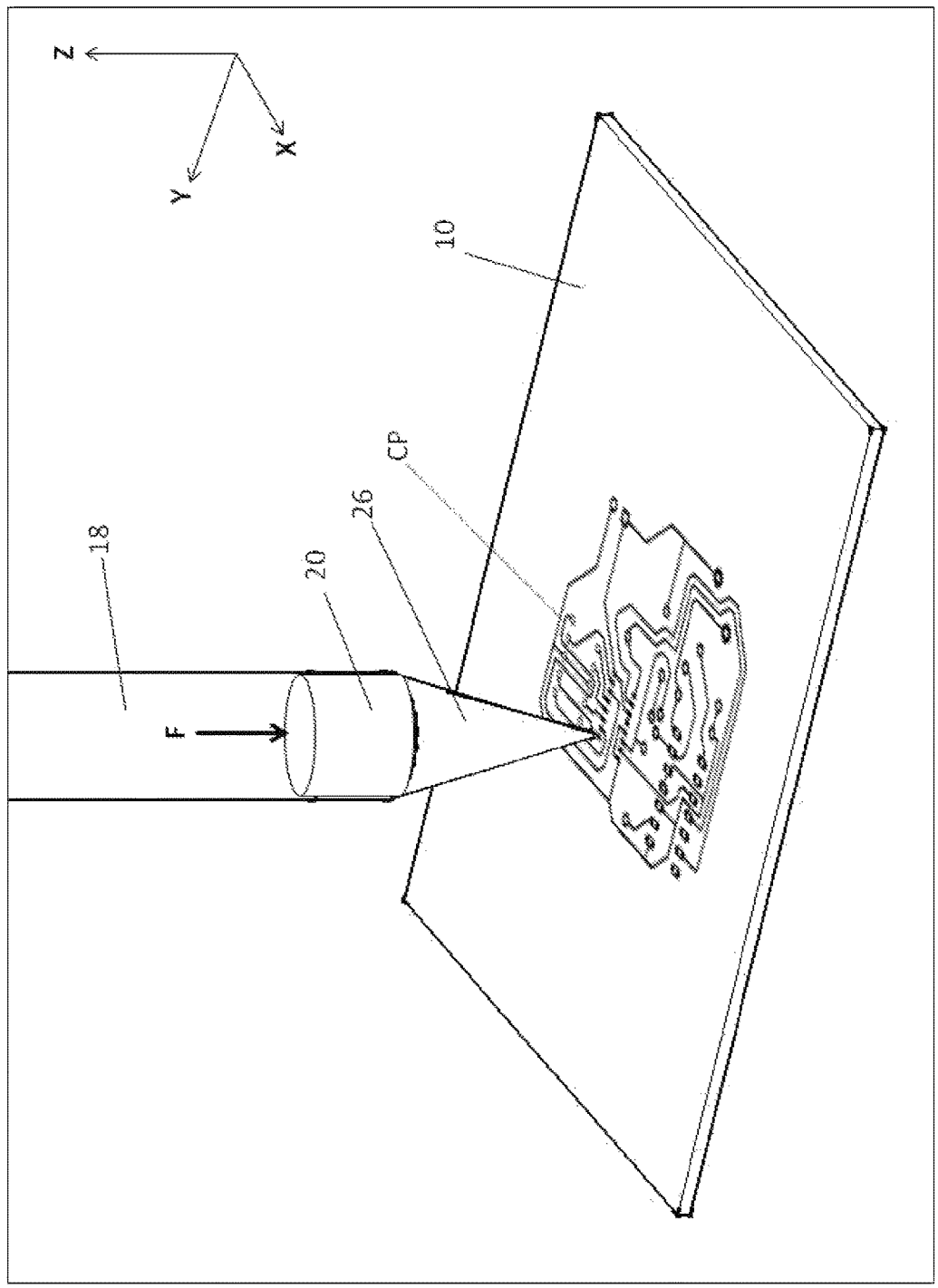
FIG. 2 is a schematic demonstrating printing of a circuit board pattern on a printing substrate, via direct-write printing method.

The printed circuit pattern is laid down onto the substrate material 10 by a direct-write method which, as shown in FIG. 2, includes: dispensing the conductive PTF paste 20, through nozzle 26, onto the substrate material 10, by applying a substantially downward force F, while moving the dispensing head 18, in the XYZ-directions, via the dispensing head carriage 16, until the desired circuit pattern CP is formed. Such a direct write method can be utilized to dispense all of the enclosed materials accordingly.

Figure 3:
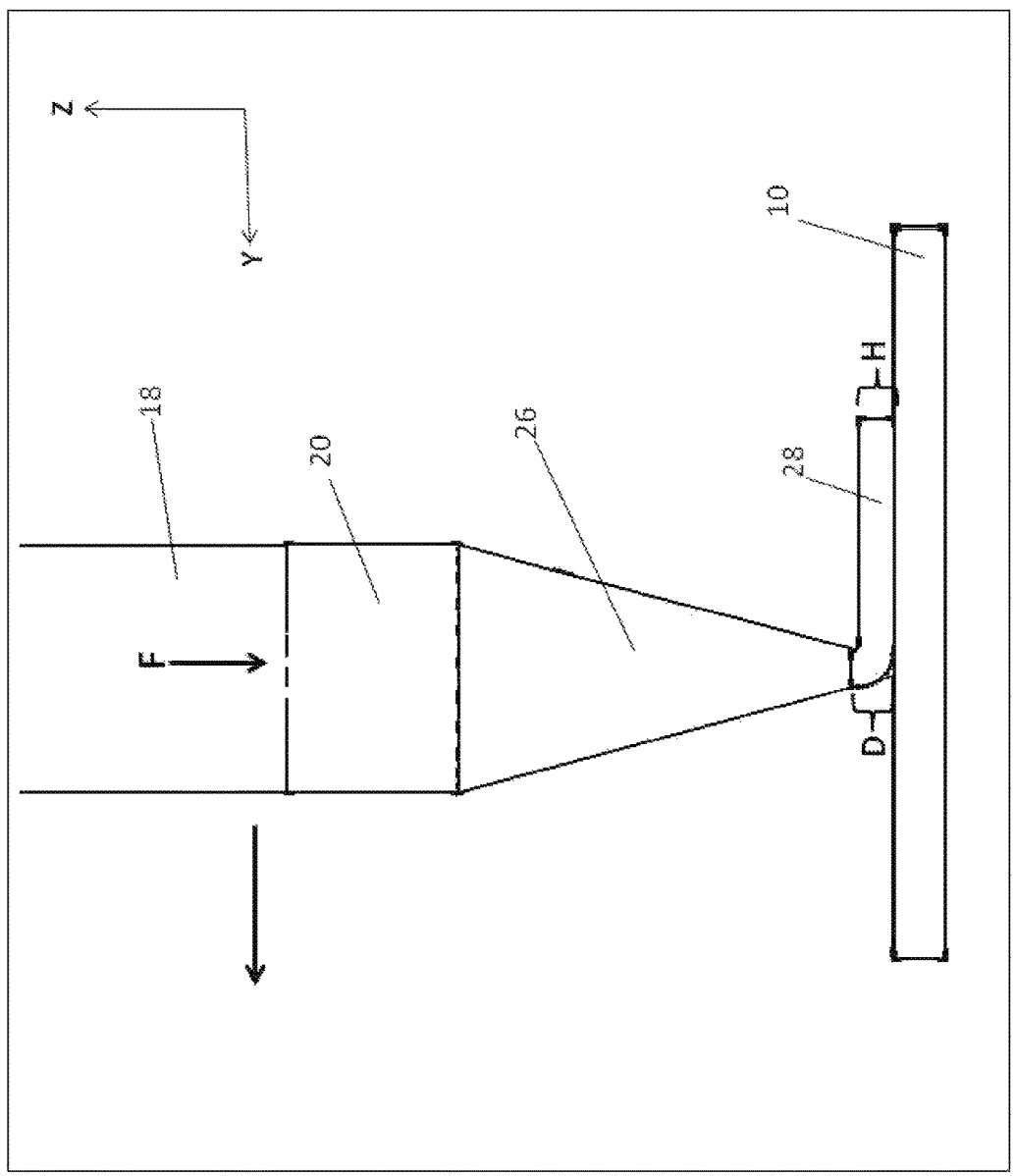
FIG. 3 is an enlarged profile view of the direct-write printing technique exemplified in FIG. 2.

FIG. 3 illustrates a direct-write printing procedure of the enclosed materials. It shows an enlarged profile view of the dispensing head 18, dispensing conductive PTF paste 20, onto substrate material 10, while moving in the Y- direction to form a continuous trace 28 of conductive PTF paste 20. The second dispensing head 22 (and any additional dispensing heads) are configured to follow substantially the same direct-write method described when printing the insulating polymer paste 24, or other such enclosed materials. In areas where dispensing is not desired, the dispensing of the enclosed materials is terminated by removing the substantially downward force F, via the controlled displacement system P. Other means of dispensing can occur to those skilled in the art.

This process of applying and removing the substantially downward force F is done in a controlled manner, by the controlled displacement system P, as needed until the desired circuit pattern CP is printed. Through this direct-write method, the conductive PTF paste 20 and insulating polymer paste 24 can be, in succession, printed in layers to form multilayer circuit board patterns. Once printing of each layer is terminated, the heated platform 12 thermally cures each dispensed layer, either serially or in parallel, in order to solidify each layer of the desired circuit pattern CP. This method of printing multilayer circuit board patterns will be discussed in greater detail below.

As shown in FIG. 1, apparatus 50 also comprises a proximity sensor S, which is mobile in the Z-direction, and configured for developing a topography map of substrate material 10 for providing control over the height between the printing nozzle 26 and substrate material 10 during formation of circuit patterns. The functionality of the proximity sensor S will be discussed in greater detail below.

The enclosed materials that are printed to form circuit patterns onto the substrate material 10, can be of a thixotropic nature, hence their viscosities can change with respect to an applied shear force. When a substantially downward force F is applied on the enclosed materials during dispensing, the shear component of force F can decrease the viscosity of the enclosed materials. This decrease can be beneficial for dispensing since a drop in viscosity can cause the enclosed materials to flow more readily out of the nozzle 26, and onto the substrate material 10. However, if the viscosity of the enclosed materials is too low it can cause undesirable spreading on the substrate material 10, hence it can create poorly resolved dispensed traces. To a person skilled in the art it will now be apparent that, throughout dispensing, the magnitude and duration of the substantially downward force F directly influences the viscosity of the enclosed materials, and hence the fluid flow out of the nozzle 26. Therefore, the duration and magnitude of the substantially downward force F can be controlled to consecutively modulate the dispensing characteristics of the enclosed materials. Controlling the substantially downward force F allows for better control of the viscosity of the enclosed materials, by manipulating their thixotropic behavior. This in turn, provides better control in dispensing the enclosed materials.

In a variation, not shown, a sensor can be provided inside dispensing head 18 or dispensing head 22, to provide feedback indicating a value of force F, to provide real-time feedback during printing, such that adjustments to force F (to accommodate the flow properties of the enclosed materials) can likewise be made in real-time. For example, a Force Sensing Resistor (FSR) can be inserted into the dispensing head, in between the enclosed materials and source of force F, thereby generating a feedback loop with the dispensing system P, such that the force is constantly regulated to maintain a consistent pressure on the enclosed materials which is optimal for dispensing.

Figure 4:
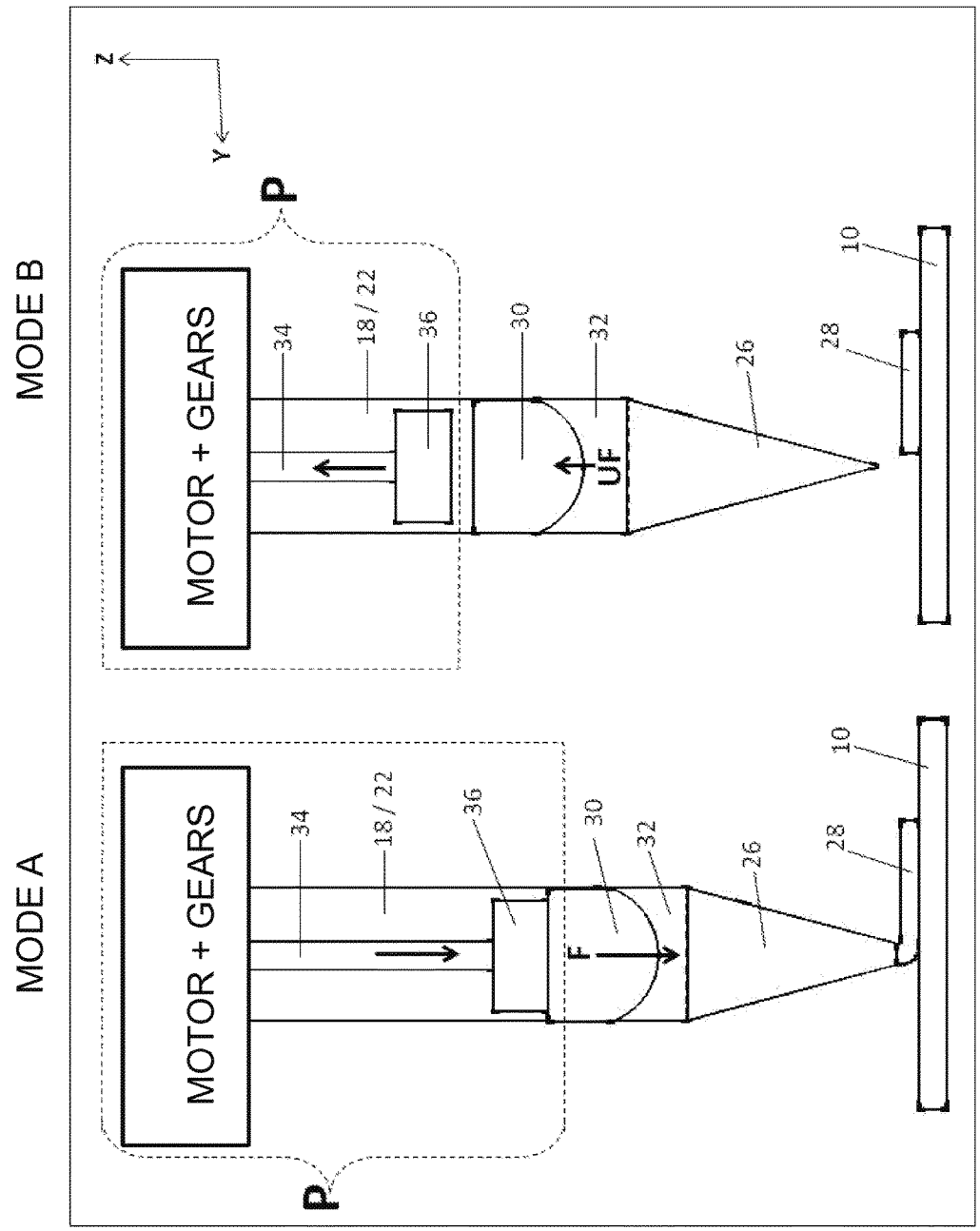
FIG. 4 shows two schematics demonstrating how conductive traces can be laid down onto a printing substrate by dispensing (MODE A) and terminating (MODE B) a print, in a controlled fashion using a controlled displacement system.

FIG. 4 shows applying a substantially downward force F on the enclosed materials, by means of a substantially downward moving plunger 30. As the plunger 30 is displaced by the controlled displacement system P, it exerts a substantially downward force F on the enclosed materials and promotes dispensing. Throughout this process, the plunger 30 will compress the enclosed materials until a yield stress is reached that allow the enclosed materials to readily flow out of the nozzle 26. The rate at which the plunger 30 is displaced, along with the amount the plunger is displaced, herein referred to as the feed-rate and plunger displacement respectfully, can determine the magnitude and duration of the substantially downward force F on the enclosed materials. Thus, the feed-rate and plunger displacement can be modifiable parameters used to control the substantially downward force F on the enclosed materials, and therefore tune their viscosity and flow characteristics. As described with reference to FIG. 1, the feed-rate and plunger displacement can be modified by the controlled displacement system P, which can be comprised of: a motor, a system of compatible gears a threaded rod and a piston.

In FIG. 4, Mode A shows how these components can be arranged to control the displacement of the plunger 30 applying a substantially downward force F on the enclosed materials 32, in accordance with an embodiment. To illustrate, a motor can be used to rotate a system of compatible gears, which cause a threaded rod 34 to move substantially downward. The threaded rod 34 can be attached to a piston 36 that can in conjunction apply a force to displace the plunger 30 substantially downward. Successively, the plunger 30 applies a substantially downward force F on the enclosed materials 32, until a yield stress is attained to promote dispensing onto the substrate material 10. As the substantially downward force F is applied, the enclosed materials 32 are compressed, resulting in a decreased volume within the dispensing heads 18 or 22. In parallel, the shear component of this substantially downward force F can decrease the viscosity of the enclosed materials 32 to enhance their flow-ability out of the nozzle 26, thus promoting dispensing of a continuous trace 28 which is part of a greater circuit pattern CP.

To terminate dispensing, as shown in relation to Mode B of FIG. 4, the threaded rod 34 can be displaced substantially upward, alleviating the plunger 30 from pressure imposed by the piston 36, and hence removing the substantially downward force F applied by the plunger 30 on the enclosed materials 32. As the substantially downward force F is removed, a relief of pressure allows the enclosed materials 32 to thicken, thus return to a more viscous state, and expand out of their compressed state. This process will increase the volume of the enclosed materials 32, thus exerting a substantially upward force UF on the plunger 30, and displacing it until an equilibrium state is reached.

Mode B of FIG. 4 shows plunger 30 decoupled from piston 36, which allows for the decoupled plunger 30 to be freely displaced as the enclosed materials 32 undergo thickening and expansion. This can promote smooth termination of dispensing and can avoid air being introduced into the nozzle 26.

In an alternative embodiment, the threaded rod 34 can be coupled directly to the plunger 30 and dispensing can be terminated by reversing the substantially downward force F applied on the plunger 30, until the enclosed materials expand to their equilibrium states. This can involve initiating the displacement system P to move the threaded rod 34, and the coupled plunger 30 substantially upward.

As mentioned, the feed-rate and plunger displacement are modifiable parameters that can be used to control the substantially downward force F, and hence control the flow characteristics of the enclosed materials. Ultimately, this can lead to controlled dispensing which can influence the quality of the dispensed traces in the circuit pattern CP.

As described with respect to Mode A and Mode B of FIG. 4, managed control of the feed-rate and plunger 30 displacement can be provided by a system of compatible gears, which allow the threaded rod 34 to be displaced in small increments. Furthermore, the motor controls the speed at which the system of compatible gears rotate, and as a result the speed at which the threaded rod 34 is displaced can be tuned. This can provide managed control of the plunger 30 feed-rate and displacement, allowing for fine-tuning of the substantially downward force F, such that it can be optimized to accommodate the thixotropic properties of all enclosed materials 32, and enhance dispensing of quality traces. The controlled displacement system P, as described with reference to FIG. 4, is an example of how the flow-characteristics of the enclosed materials 32 can be manipulated, by using the suggested equipment, to control the substantially downward force F. However, there are other methods of achieving such control of the substantially downward force F on the enclosed materials 32, and those skilled in the art will now, with the benefit of this disclosure, be familiar with such methods. For instance, in an alternative embodiment encompassing a gas chamber as the controlled displacement system P, pressurized gas can be released into the dispensing heads in managed amounts, to control the pressure exerted on the plunger 30. As a result, the plunger 30 feed-rate and displacement can be managed to apply a controlled substantially downward force F on the enclosed materials 32.

Similarly to how dispensing can be tuned through control of the substantially downward force F, termination of dispensing can also be tuned by controlled reversal of the substantially downward force F, using the suggested equipment or variations thereon. Removing the applied substantially downward force F can cause the viscosity of the enclosed materials 32 to increase back to their original state. When the enclosed materials 32 are in a more viscous state, they do not flow as readily out of the nozzle 26, and this can facilitate termination of dispensing. In this way, controlling the rate at which the substantially downward force F is removed, can be utilized to determine the viscous state of the enclosed materials 32, and hence to terminate dispensing at different rates.

As described with reference to Mode B of FIG. 4, the rate at which the substantially downward force F is reversed can be managed by controlling the feed-rate the threaded rod 34 is reverted upward, and away from the plunger 30. Through this process of applying and removing the substantially downward force F at different rates, the viscosity of the enclosed materials 32 can be managed, such that the dispensing rate can be optimized to print nicely resolved traces (i.e. traces having a substantially uniform width and height) that render a functioning electrical circuit within circuit pattern CP. The optimal rate of application/reversal of the substantially downward force F is dependent on the initial viscosity and thixotropy of the enclosed materials 32, therefore can vary amongst different enclosed materials 32. A process control methodology can be implemented to find the optimal rate of application/reversal of the substantially downward force F that is customized to each of the different types of enclosed materials 32 used for dispensing.

In addition to the feed-rate and plunger 30 displacement, other parameters responsible for printing nicely resolved traces can include, but are not limited to: printing speed, printing distance, desired trace height, and desired trace aspect ratio. The printing speed refers to the speed at which dispensing head 18 and/or dispensing head 22, move while dispensing the enclosed materials onto the substrate material 10, to form a circuit pattern CP. The printing speed can determine the continuity of the traces within the circuit pattern and therefore, as with the feed-rate and plunger 30 displacement, it is preferable to manage this parameter throughout dispensing.

As described with reference to FIG. 1, managed control of the printing speed can be accomplished by controlling the speed at which the dispensing carriage 16 moves while printing. Since movement of the dispensing carriage 16 can be driven through linear guide rails Rx and Ry, the speed at which this movement is generated can be managed by motors (not shown) on opposite sides of the linear guide rails. This arrangement generates movement in the dispensing carriage 16, and a means of controlling its speed to manage the printing speed should now be apparent to those skilled in the art.

The printing distance is another parameter that can be manipulated by the user to assist in printing quality traces. Printing distance refers to the distance D, shown in FIG. 3, between the nozzle 26 and substrate material 10, and is comparable to the trace height H. The printing distance D will be described in greater detail below. Collectively, the printing distance D can be adjusted to obtain the desired approximate trace height H, while the plunger 30 feed-rate, plunger displacement and printing speed, can be together optimized to obtain the desired aspect ratio of the traces. This process of cumulatively fine-tuning these parameters, herein referred to collectively as the print settings, can be applied to dispense resolved traces, of desired dimensions, within the circuit pattern CP.

While printing according to the teachings herein, the printing distance D is maintained at a substantially consistent value during the entire print, in accordance with an embodiment. However, the printing distance D, can be within a range that can vary based on the consistency of the enclosed materials 32. Such a range can be optimized to accommodate each enclosed material and can vary according to nozzle 26 diameter. For example, for a nozzle 26 diameter of 230 µm, a presently preferred range for distance D can be between about 150 µm to about 230 µm to dispense continuous traces having a uniform aspect ratio (other ranges will be discussed below). The goal in this is to avoid poorly dispensed or discontinuous traces and hence an overall poor quality circuit pattern.

Referring again to FIG. 3, it can be seen that the printing distance D, between the dispensing nozzle 26 and the substrate material 10, can correspond to the approximate height H of the dispensed trace 28. In an embodiment, under the condition that the print settings have been optimized to a desired trace aspect ratio (namely, the ratio between the width of the dispensed trace 28 and height H) if the printing distance D is maintained within a predefined range, then the desired dispensed trace 28 height H, can be comparable to the printing distance D. The dispensed trace height H can be modified by adjusting the printing distance D, and accordingly modifying the print settings to the desired trace 28 aspect ratio.

In an embodiment, a range for the printing distance D is, for example, about 1 µm to about 400 µm. However, a preferred range for the printing distance D can vary based on the print settings and the properties of the enclosed materials 32 (i.e. viscosity, thixotropy, density). If the printing distance D drifts out of the ideal range, the dispensed traces can be discontinuous or unresolved. For instance, if the printing distance D drifts below a desired range, the nozzle 26 can be too close to the substrate material 10, such that there might be a buildup of enclosed material 32 around the nozzle 26 during dispensing, or the nozzle 26 can scrape the surface of the substrate material 10 and be damaged. In contrast, if the printing distance D exceeds a desired range, the nozzle 26 can be too far away from the substrate material 10, such that the enclosed materials 32 are dispensed as beads rather than as continuous traces. Under the assumption that the print settings are accordingly calibrated, maintaining the printing distance D within the predefined range can provide resolved and continuous printed traces 28 of the desired trace height H which result in electrically functional circuit patterns CP.

Providing a substantially consistent printing distance D, within a predefined range, can be difficult due to height variations on the surface of the substrate material 10, or other variables such as imperfections in stage 14, or rail Rx, or rail Ry, or other related components in apparatus 50. Therefore, to maintain a substantially constant printing distance D between the nozzle 26 and substrate material 10 throughout dispensing, the height profile of the substrate material 10 can be determined by a proximity sensor S. Proximity sensor S is incorporated to map out the surface of the substrate material 10 prior to printing, hence it generates a map of the entire printing surface. Once a map is created, the printing controls can use it as a guide to adjust the Z-position of the dispensing head 18 and dispensing head 22, via guide rail Rz, such that the printing distance D is maintained substantially constant. This can also be accomplished, in an alternative embodiment, if the entire dispensing head carriage 16 is free to move in the Z-axis via a Z-rail system.

In an embodiment, a surface mapping sequence is performed prior to dispensing. In this embodiment, the sequence comprises: the dispensing head carriage 16, moving along the XY-directions, and across the substrate material 10, while a touch probe sensor S, moves in the Z-direction, making periodic contact with the substrate material 10, in predetermined areas on the surface. As the touch probe sensor S makes contact with a point on the surface of the substrate material 10, the Z-position of the sensor is recorded. A series of these contact points create a grid, referred to henceforth as a height map, which stores information of the Z-direction leveling across the surface of substrate material 10. The height map interpolates information about the entire printing surface, and can be interpreted as the approximate topography of the substrate material 10. This provides information to the dispensing heads 18 and 22, of detected height variations on the surface of substrate material 10. After the height map is established, it can be used to maintain a substantially constant printing distance D, between the dispensing nozzle 26 and the substrate material 10, during printing of the circuit pattern.

Presently preferred mapping comprises determining a distance D once about every two millimeters, assuming substrate material 10 is divided into a grid of two millimeter by two millimeter squares. However, other probing densities are configurable and contemplated. While printing the circuit pattern CP onto the substrate material 10, via the direct-write method described with reference to FIG. 3, the dispensing head 18 and dispensing head 22 can use the predetermined height map, and accordingly adjust their position in the Z-direction, in order to maintain a substantially constant printing distance D between the dispensing nozzle 26 and substrate material 10.

In an embodiment, the touch probe sensor S is kept from contacting with the substrate material 10 during printing. In this embodiment, touch probe sensor S only contacts the substrate material 10 when generating a height map and when dispensing heads 18 or 22 are not dispensing.

The present embodiment contemplates that touch probe sensor S is used for generating a height map prior to printing. In this embodiment, touch probe sensor S has a tip that is biased towards substrate material 10. Dispensing head carriage 16 moves touch probe sensor S in the XY-plane over various locations of substrate material 10, periodically lowering touch probe sensor S in the Z-axis towards the surface of substrate material 10. When the tip of touch probe sensor S makes contact with the surface of substrate material 10, the tip is urged away from substrate material 10 until an electrical contact is established within the electro-mechanical assembly of touch probe sensor S. The distance that the touch probe sensor S was displaced in the Z-axis during contact with the surface of substrate material 10 is recorded throughout the entire the mapping region. Thus, forming a grid of points along the surface of substrate material 10 and determining a distance D for a given location on the substrate material 10. However, alternative embodiments for mapping the topography of the substrate material 10 can include, for example: optical sensors, inductive sensors, capacitive sensors, ultrasonic sensors and the like. Alternative embodiments can also include establishing a height map in real-time, during printing, instead of prior to.

Figure 5:
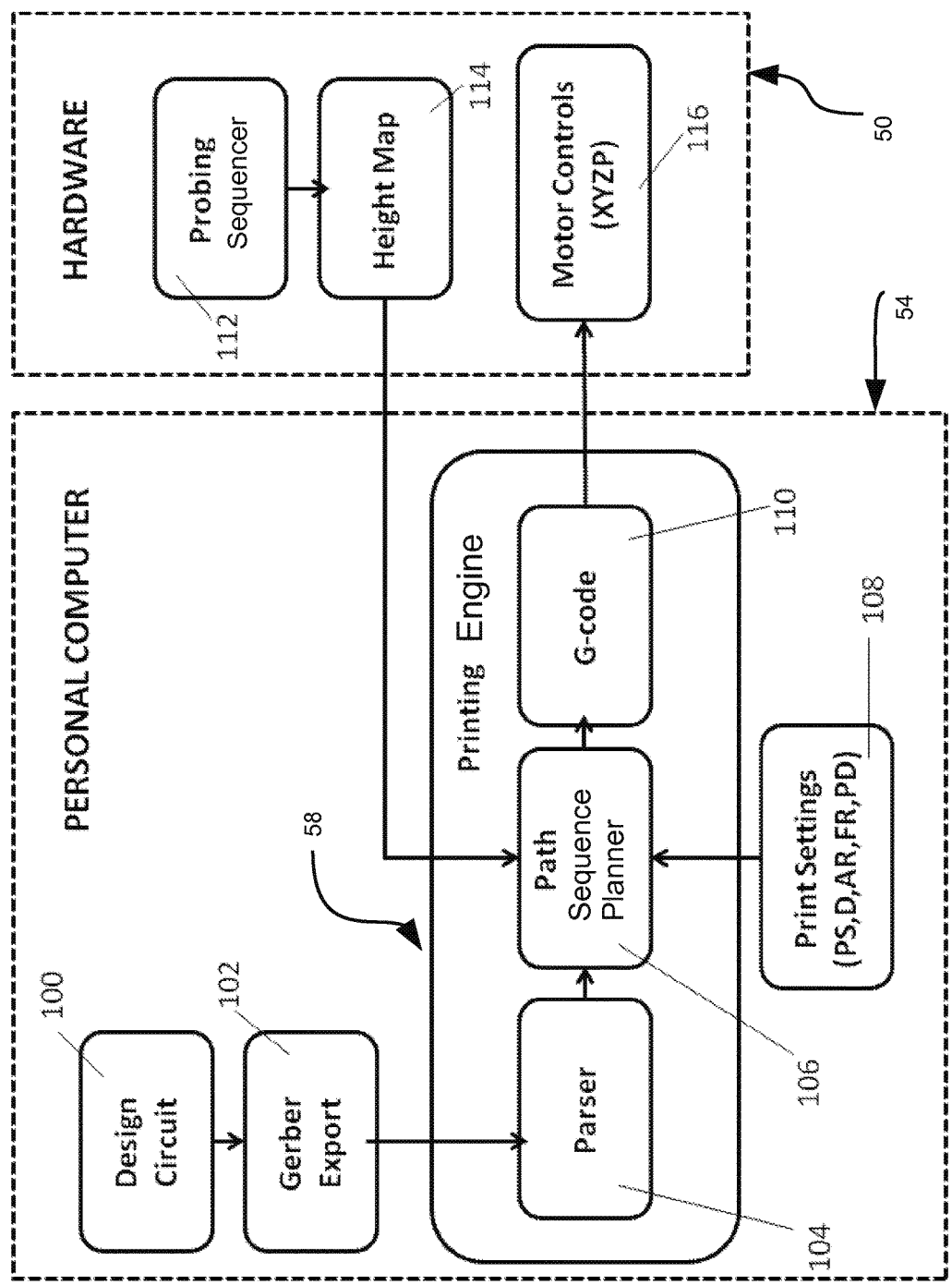
FIG. 5 is a system diagram illustrating the printing controls of the apparatus of FIG. 1.

FIG. 5 shows a printing control system, comprised of apparatus 50 and a personal computer 54, in accordance with an embodiment. Personal computer 54 can be any known or future conceived functionally equivalent computer. Personal computer 54 comprises a chassis that houses a central processing unit (CPU), volatile storage (such as random access memory), non-volatile storage (such as a hard disk drive), input device(s) (such as a keyboard, a mouse), output device(s) (such as a monitor, printer, speakers), and input/output devices including at least an input/output interface and driver to connect to apparatus 50. It is to be understood that the nature of the link between personal computer 54 and apparatus 50 is not particularly limited and could be wired or wireless, either locally or through a wide area network. The schematic representation of personal computer 54 in FIG. 5 includes software-based functional blocks that execute on the above-described hardware or equivalents, thereby rendering general purpose personal computer 54 into a specific state machine configured for the purpose of controlling apparatus 50. It is to be understood that the software-based functional blocks could be incorporated directly into hardware to create a computer 54 that is specifically designed to control apparatus 50.

The functional blocks of personal computer 54 include the circuit design 100 for the desired circuit pattern CP, generated using suitable design software. Cadsoft Eagle™ from CadSoft Computer GmbH is one example of circuit board design software which can be utilized to design their circuit board. The circuit design 100 can be saved as a Gerber layout file 102. (A Gerber layout file is based on the file format originally developed Gerber Systems Corp. As of June 2015, the current Gerber file format is owned by Ucamco NV, Gent Belgium.) Gerber layout file 102 is a standard 2D vector image file format used to describe the printed circuit board image on a XY-plane. The saved Gerber layout file 102 of the design circuit 100 is then passed to the printing engine 58. Gerber layout file 102 of the circuit design 100 is then run through a printing parser 104, which processes the data (e.g. from the Gerber file) into vectors that dispensing head 18 and dispensing head 22 of apparatus 50 can follow during printing of the circuit pattern CP. Although Gerber layout files can be the standard used for circuit board designs, alternative embodiments can use other file formats such as PDF, DXF, JPEG, PNG, and the like.

The printing engine 58 then takes the output from the parser 104 and passes it to a path sequence planner 106, in which the interpreted vectors can be organized in a sequence to print the circuit pattern CP. The path sequence planner 106 can be configured to generate an optimized path sequence that minimizes, or at least reduces, the amount of travel necessary for each dispensing head 18 and dispensing head 22. The path sequence planner 106 can also take into account the said print settings 108, such as: printing speed PS, desired printing distance D, desired trace aspect ratio AR, plunger feed-rate FR, and plunger displacement PD. As stated, the print settings 108 can include user controlled parameters that can be tuned for the purpose of dispensing quality traces. The print settings 108 can be considered when the path sequence planner 106 is creating a print path for dispensing head 18 and dispensing head 22 to follow.

Once substrate material 10 is in place, then, where used, the proximity sensor S can commence its height probing sequence using height probing sequencer 112, of the substrate material 10 to generate a height map 114. Information from the height map 114, can be incorporated into the path sequence planner 106, so that the printing path can be optimized in the Z-direction, to accommodate for height variations in the surface of the substrate material 10, (or other variables that influence travel height of dispensing head 18 and dispensing head 22), and maintain the desired printing distance D. The optimized circuit print path can then be used to generate G-code 110 corresponding to the Gerber layout file 102. As understood by those skilled in the art, G-code 110 is expressed in a numerical control programming language that can be understood by motor controls 116 of apparatus 50. The generated G-code 110 can then be relayed to the motor controls 116, which can generate mechanical movements to print the circuit pattern CP.

In an embodiment, the motor controls 116 can relay information to motors which move the dispensing heads 18 and 22 in the XYZ-directions, via Rx, Ry and Rz guide rails, and in the circuit print path generated by printing engine 58. The motor controls can move dispensing head 18 and dispensing head 22 in the Z-direction, via Rz guide rails, to maintain the printing distance D, while accommodating surface height variations detected by the generated height map, 114. Meanwhile, motor controls can activate a displacement system P, as shown in FIG. 4, to dispense the enclosed materials 32 in a controlled fashion, by managing the substantially downward force F, as described herein with reference to Mode A and Mode B of FIG. 4.

The printing control diagram of FIG. 5 represents a simplified schematic of how the apparatus of FIG. 1 can utilize a Gerber layout file 102 of a circuit board design 100 and convert it into mechanical XYZ-directional movements of the dispensing heads 18 and 22, while simultaneously operating the displacement system P, to dispense the circuit board pattern CP.

The printing control system described with reference to FIG. 5 can be valid for printing single layer or multilayer circuit boards. A single layer circuit board includes only one layer of the conductive PTF paste 20 to be printed as the designed circuit pattern CP and cured. Where dispensing head 18 prints the circuit pattern CP onto the substrate material 10, the conductive PTF paste 20 can be cured by elevating the temperature of the heated platform 12 to the supplier recommended curing temperature. Curing cycles typically range from, for example, about 80° C. to about 300° C. for about three minutes to about three hours, and can vary based on conductive PTF 20 paste type.

In an embodiment, curing of the conductive PTF paste 20 can last for about 3 minutes to about 15 minutes at about 150° C., or, where solderability is desired, then the curing can last about 200° C. for about thirty minutes to produce conductive traces after printing. Curing times and temperatures are specific to the PTF material dispensed and can vary amongst suppliers. Where enhanced solderability is desired substrate material 10 can be turned upside down and placed on a slightly elevated object about half a millimetre to two millimetre thick, so that the conductive PTF paste 20 printed pattern is in proximity, but not touching, the heated platform 12 during the curing cycle. In the preferred embodiment, curing the printed circuit pattern CP with the conductive and insulating dispensed materials directly facing the heated platform has been shown to improve the solderability of components after curing. After curing, the heated platform 12 can be allowed to return back to room temperature. This cooling cycle can be accelerated by integrating a cooling system, such as fans, around the heated platform 12. A system to generate air flow around the substrate material 10, during curing can also be integrated to sweep the evaporating solvent away from the printing area.

Printing of a multilayer board can, optionally, utilize activation of a second dispensing head 22, which dispenses insulating polymer paste 24, through a nozzle 26, to form an insulating barrier between dispensed conductive traces. Insulating polymer paste 24 can be used in areas of the circuit pattern CP where conductive traces of different layers are intended to overlap. The insulating polymer paste 24 can be insulating once cured, and thus can inhibit short circuiting between the overlapping conductive traces. Where insulating polymer paste 24 is dispensed via direct-write method, an independent curing cycle can be implemented to evaporate the solvent and harden the polymeric material.

Figure 6:
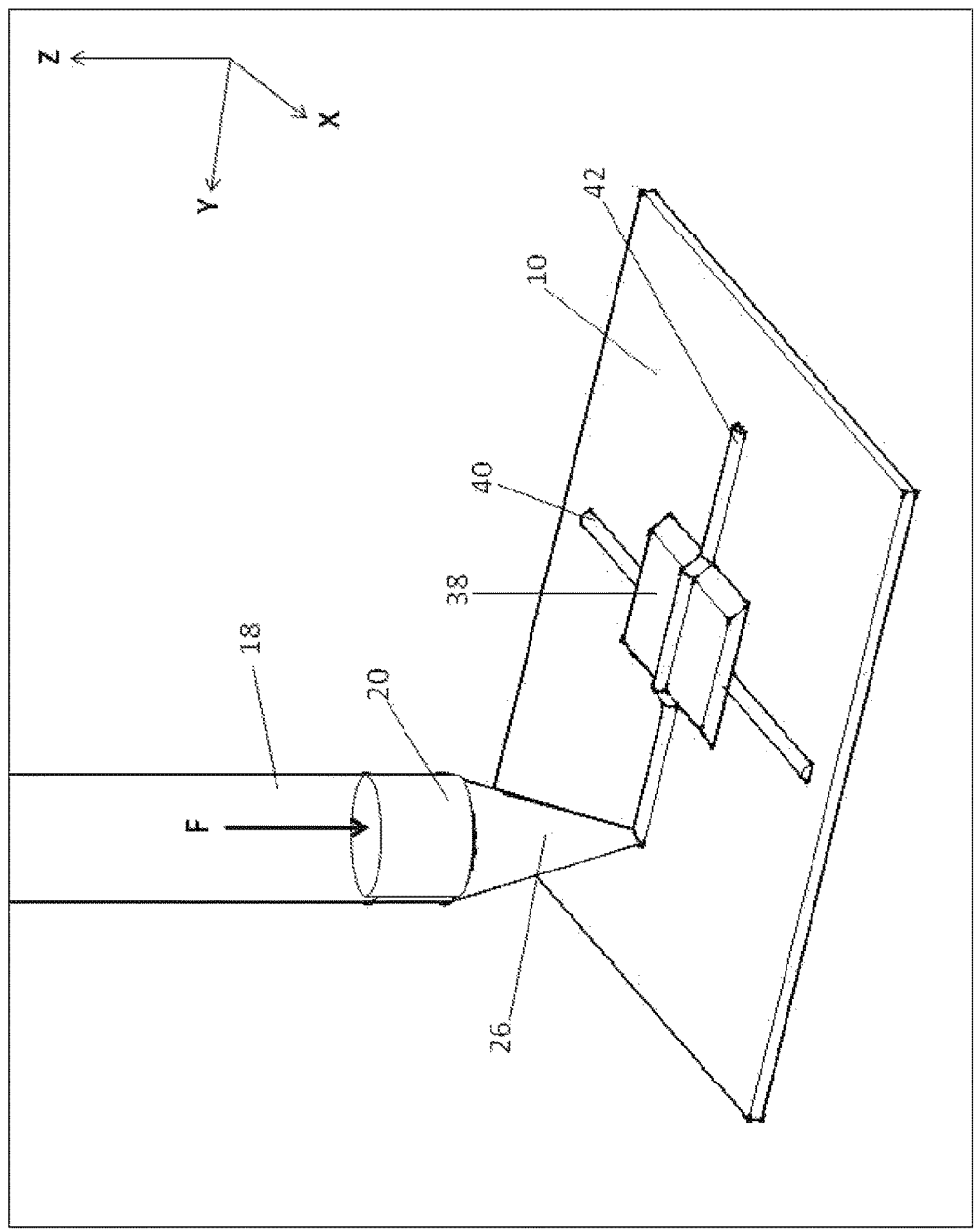
FIG. 6 is a schematic of insulating polymer paste creating an insulating barrier between overlapping conductive traces of different layers.

FIG. 6 shows, in an embodiment, an enlarged view of a simplified case where one can utilize insulating polymer paste 24 in a circuit board design. Shown here, are two overlapping, and independent layers of conductive traces, which are part of a greater circuit pattern CP and, which are separated by a barrier of cured insulating polymer paste 38. The first layer conductive trace 40, can be printed by dispensing head 18, dispensing conductive PTF paste 20, onto the substrate material 10, via the direct-write method described prior to. After dispensing this first layer of conductive PTF paste 20, the heated platform 12 can be automatically initiated to go through the curing cycle and solidify the dispensed conductive trace 40. The curing cycle can include an initial drying step to harden a single layer, or plurality of dispensed layers, prior to undergoing a co-curing step that fully cures the plurality of layers cumulatively. Curing a plurality of dispensed layers together can be time-saving to the overall process. When curing is complete, the heated platform 12 can be brought back to room temperature; this process can be accelerated by an integrated cooling system.

Figure 7:
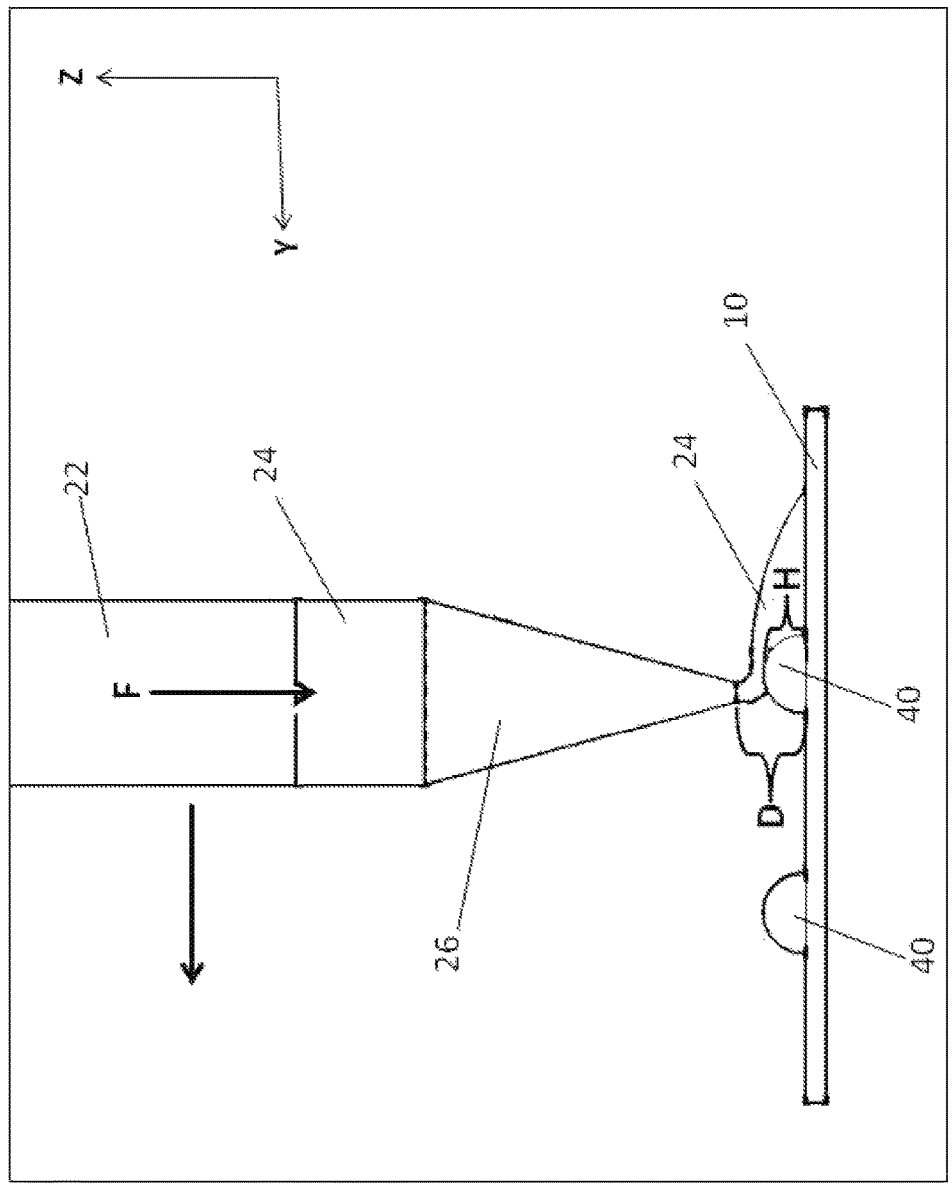
FIG. 7 is an enlarged profile view of dispensing of insulating polymer paste over a conductive trace to form the insulating barrier of FIG. 6; and, FIG. 8 is a flow chart illustrating a process that the apparatus described in FIG. 1 can follow to print multilayer circuit board patterns.

FIG. 7 shows an enlarged profile view of insulating polymer paste 24 being dispensed over the first layer conductive trace 40, to form the insulating barrier 38 of FIG. 6. As seen in FIG. 7, a second dispensing head 22 can dispense insulating polymer paste 24 through nozzle 26, over the first conductive trace 40, which can then be cured to form a solid insulating polymeric layer 38 (in FIG. 6). FIG. 7 also shows that a pre-determined trace height H, can be calculated for in the circuit design and, by the printing controls exemplified in FIG. 5, dispensing head 22 can adjust its Z-position to maintain the selected printing distance D, while dispensing insulating polymer paste 24 over the first layer conductive trace 40.

Referring again to FIG. 6, dispensing head 18 can be automated to print another conductive layer 42 over the insulating polymer paste 38, hence forming two overlapping conductive traces separated by an insulating barrier. This process of printing/curing conductive and insulating fluids can be repeated many times to fabricate complex multilayer circuit boards. The schematic of FIG. 6 shows a basic overlap of two conductive traces in a circuit pattern for simplicity. However, using the same printing procedure described in FIG. 6 and FIG. 7, a desired multilayer circuit pattern can be printed to produce complex multilayer boards.

Figure 8:
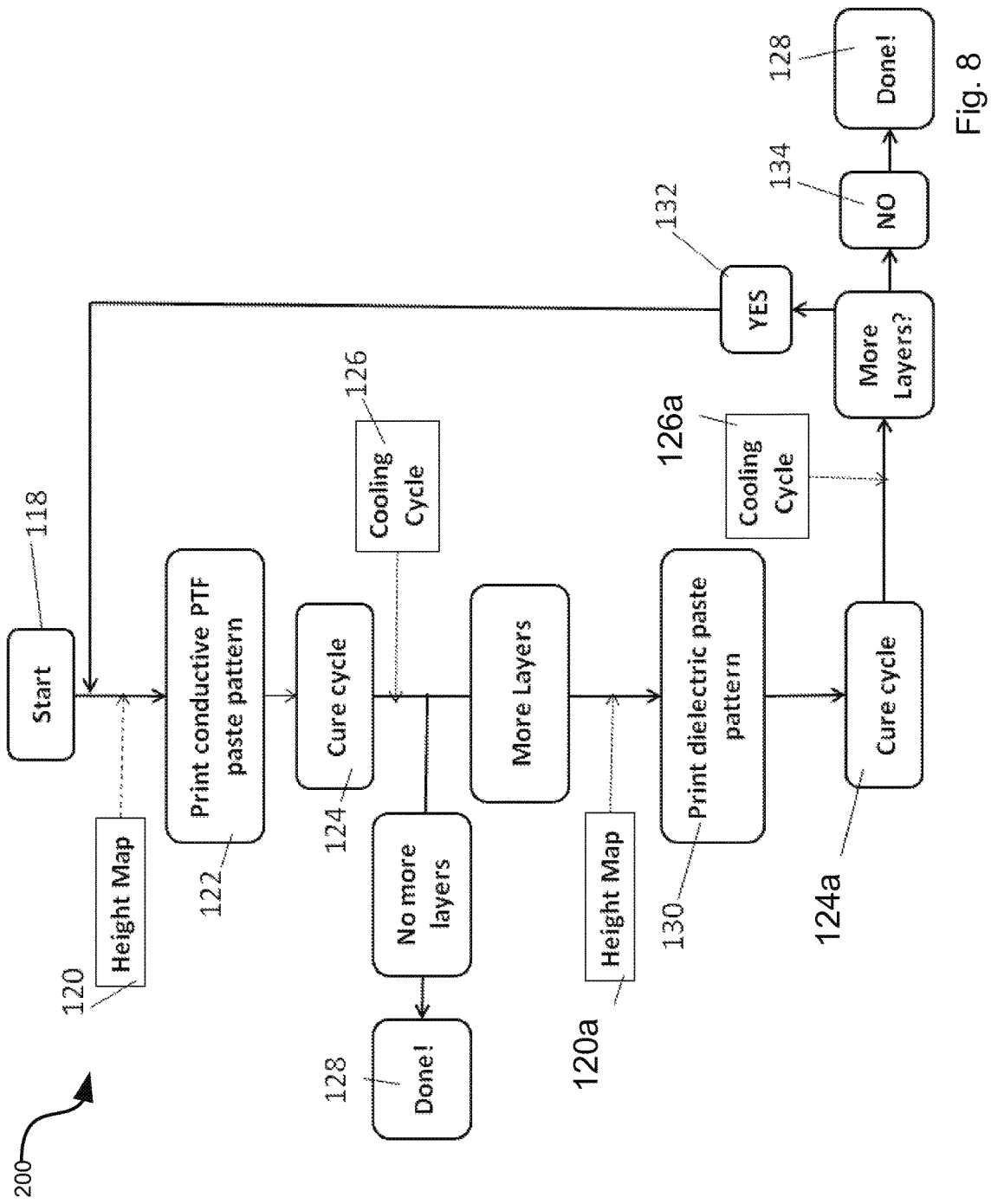

A printing process flow chart is indicated generally at 200 in FIG. 8, which describes how the apparatus 50 of FIG. 1 can be operated in accordance with an embodiment. After designing the circuit pattern CP, the desired printing material (e.g. substrate material 10) can be affixed to the platform 12. At this point process 200 can be commenced at the start block 118. At block 120 the proximity mapping procedure is commenced, to obtain a height map of the surface of substrate material 10. Once a height map of the surface is established, then at block 122, dispensing head 18 can print conductive PTF paste 20, as described, and establish the first layer of the circuit pattern CP. Block 122 can include printing a singular conductive layer, or a plurality of conductive layers to build up the trace height, or with the prospect of curing a plurality of layers together to save time. Next, the conductive PTF paste 20 circuit pattern CP printed in block 122, can be cured by the heated platform 12, according to block 124, followed by a cooling cycle, at block 126, which brings the heated platform 12 back to a suitable temperature. Optionally, cooling can be accelerated by an integrated cooling system.

In the case where a single layer board is being printed, and there are no more layers, the print job is complete, as per block 128. Whereas, if printing a multilayer board, more layers are to be printed, in which case the substrate material 10 can undergo another proximity mapping procedure at block 120a. (Indeed the substrate material 10 can, depending on the context, deform or warp during curing at block 124). In printing the second layer at block 130, the insulating polymer paste 24 can be dispensed by dispensing head 22, over the desired areas of the conductive PTF paste pattern, and can then undergo a curing cycle at block 124a, to solidify the printed insulating paste pattern.

The heated platform 12 can generate custom cure profiles for the conductive PTF paste 20, and insulating paste 24 during the curing cycles. At this point, the heated platform 12 can undergo another cooling cycle, at block 126a, and bring the heated platform 12 back to suitable printing temperature. Assuming there are no more layers to be printed, as indicated at block 134, the circuit board printing procedure is done, as per block 128. However, if more layers are desired, as per block 132, then the substrate material 10 can again undergo the proximity mapping procedure at block 120, and go through the entire printing cycle many times, until the desired number of layers is printed.

Figure 9:
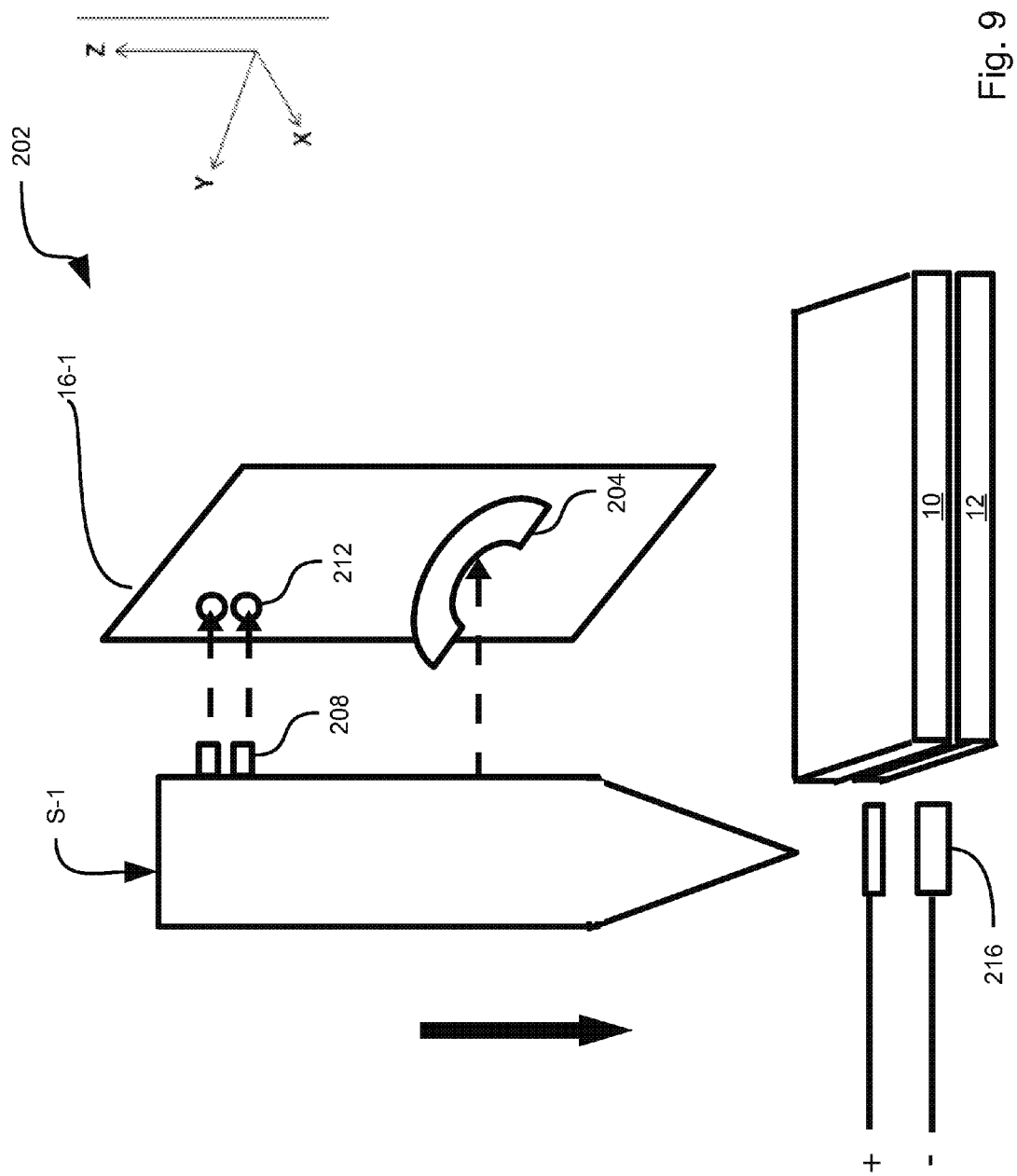
FIG. 9 is a mechanical schematic of a probe sensor in accordance with another embodiment.

Referring now to FIG. 9, a touch probe sensor in accordance with another embodiment is indicated at S-1. Touch probe sensor S-1 is a variant on touch probe sensor S. Touch probe sensor S-1 is shaped in a configuration that is similar to dispensing head 18. Touch probe sensor S-1 is part of a dispensing carriage assembly 202 that comprises touch probe sensor S-1 and dispensing carriage 16-1. Dispensing carriage 16-1 is itself, a variant on dispensing carriage 16. Dispensing carriage 16-1 comprises an attachment mechanism 204, represented in FIG. 9 as a clip that is configured to receive touch probe sensor S-1. Also of note is that dispensing carriage 16-1 is configured only for a single dispensing head (not shown), and that in assembly 202, touch probe sensor S-1 has a form factor that is similar to a dispensing head (not shown). Touch probe sensor S-1 includes at least one electrical contact 208 that mates with corresponding at least one electrical contact 212 mounted on dispensing carriage 16-1. Electrical contacts 208 are associated with circuitry (not shown) inside touch probe sensor S-1 that identify touch probe sensor S-1 as such to a control circuitry (not shown) associated with dispensing carriage 16-1. In this manner, touch probe sensor S-1 can be swapped with dispensing heads (not shown) which also include electrical contacts 208 that identify dispensing heads (not shown) as such to control circuitry associated with dispensing carriage 16-1. Dispensing carriage assembly 202 also comprises a normally open contact switch 216 that is mounted on a modified version of apparatus 50 to provide an absolute reference height, as will be discussed further below.

In operation, touch probe sensor S-1 is affixed to dispensing carriage 16-1 via attachment mechanism 204. Electrical contacts 208 and electrical contacts 212 are connected to control circuitry associated with dispensing carriage 16-1 to detect the presence of touch probe sensor S-1. Next, the control circuitry lowers dispensing carriage 16-1 until contact switch 216 is closed to provide a reference height. It will be noted that contact switch 216 is positioned so that a reference height can be ascertained. The downward travel distance is recorded by the control circuitry; such recording occurring at the point contact switch 216 is closed. At this location in the Z-axis, at the point of contact, the tip of touch probe sensor S-1 is now known. Next, the control circuitry that moves touch probe sensor S-1 across the surface of substrate material 10, periodically making contact with the surface, in order to accomplish the mapping. It will now be apparent that the foregoing can be performed by the probing sequencer 112 (serving the function of the control circuitry of dispensing carriage 16-1) in order to generate a height map 114, all as previously discussed above in relation to FIG. 5, but according to the modified approach discussed above. Advantageously it will also be noted in this embodiment that only a single dispensing head is provided, and the originally discussed touch probe sensor S is obviated, thereby simplifying the construction of dispensing carriage 16-1. In such an embodiment, any of the enclosed materials 32 described herein can be interchanged and attached onto the configurable dispensing carriage 16-1. For example, the touch probe sensor, conductive PTF paste, and insulating polymeric paste can be successively swapped for operation, as needed to print the desired circuitry. Additionally, a dispensing head enclosing solder paste can be interchanged onto dispensing carriage 16-1 to deposit solder paste onto the allocated areas of the circuit pattern CP for electrical component attachment.

This introduces yet another aspect of the present disclosure: a solder paste dispensing feature having capabilities to dispense solder paste onto circuit boards, which are fabricated by either traditional methods (chemical etching, outsourced etc.), or by methods facilitated by the present disclosure described herein. A circuit board pattern will contain pads, which function as surface area to attach electrical components that unite traces of the circuit board pattern. Once the circuit board is secured onto the stage 14, the location of pads reserved for component attachment can be extracted through a pad locating sequence. Such a pad locating sequence can be performed by integrating a machine vision system into apparatus 50. Machine vision systems such as vision sensors, smart cameras, and lighting systems should be familiar to those skilled in the art. Alternatively, touch probe sensor S-1 can serve a bi-functionality, and in succession to generating a topographical map of the circuit board, can be utilized to locate the pads. This can be accomplished by positioning the touch probe sensor S-1 directly over at least two reference pads of the circuit pattern CP, and recording their XYZ-location. From there the remainder of the pad locations can be identified through software by accommodating for the translational and rotational discrepancies between the Gerber input, and that recorded by the touch probe S-1. Alternatively, the dispensing nozzle 26 can be positioned directly over the reference pads and record their locations. Once the location of the pads are determined as described, dispensing carriage 16-1 can proceed to dispense solder paste onto the desired pads. Pads can also be included or excluded from solder paste dispensing through the software interface. Once the solder paste has been deposited with satisfactory area coverage (>80%), the electrical components that comprise the circuit can then be placed by hand, or by an additional automated attachment such as a pick and place system, onto their allocated area, where the heated platform 12 can reflow solder them via the user-specified reflow profile. The reflow profile consists of modulating the temperature of the heated platform 12 to form the solder joints comprising the electrical and mechanical connection between the components and the pads. The heated platform 12 is heated in order to melt the solder paste uniformly across the circuit board, and induce the melted solder to join with the metal leads of the electrical components. The heated platform 12 then cools to room temperature, causing the solder joints to solidify, thus creating a mechanical and electrical connection between the electrical components and the pads. The reflow profile can be tuned for the particular metal solder alloy through software, which would become apparent to those skilled in the art. Solder paste dispensing can be accomplished on circuit boards printed using the processes described herein, or on traditionally fabricated circuit boards, hence eliminating the need for stencils. For circuit boards printed using the processes described herein, low-temperature solder alloys with low silver content, such as SnBiAg alloys, are preferred. Alternatively, the components can be hand soldered, if desired. Hand soldering can be enhanced by curing the printed circuit pattern CP in such a way that it directly faces the heat source, as the prior to.

It is an aspect of the present disclosure to include a proposition for accommodating vias in a circuit board pattern. Vias can be included in template boards as predrilled, and optionally metal plated, holes in the substrate material 10. The circuit pattern CP can be designed around the predrilled vias, and once the substrate material 10 is secured onto the stage 14, the location of the predrilled vias can be extracted using a parallel procedure to that described with pad locations prior to. Then, the circuit pattern CP can be dispensed around the vias, such that the printed traces form a direct connection to the desired vias, and fully incorporate them into the circuit pattern CP. The circuit pattern CP can then be fully cured to form an electrical connection with the incorporated vias. It should now become apparent to those skilled in the art that this protocol can be used to couple circuitry printed on both sides of the substrate material 10. If the vias are not metal plated prior to printing, conductive PTF paste 20 can be dispensed directly into the vias where an electrical connection to the opposite side of the substrate material 10 is desired. In this way, conductive PTF paste 20 can serve the function of a through-hole wire, which is traditionally inserted through vias to connect circuitry on opposing surfaces of a printed circuit board. Alternative to predrilled vias, the vias can be drilled post printing and curing of the circuit pattern CP on one, or both sides of the substrate material. This induces yet another embodiment of the present disclosure, in which a drill attachment can be made compatible with the dispensing carriage 16-1 for the intent of drilling out vias directly on the printing stage 14 of apparatus 50, after curing of the circuit pattern CP. A drill head can be permanently integrated into apparatus 50, or be yet another complementary detachable element with the dispensing printhead carriage 16-1.

It will be appreciated that the above description relates to the embodiments by way of example only. Variations, combinations and subsets of the embodiments discussed herein will be now be apparent to those skilled in the art. For example, the heated platform 12 need not be immobilized, and can be placed on mobile X, Y and Z axes in lieu of or in addition to providing linear guide rails, Rx, Ry and Rz, and the driving movement of dispensing head carriage 16 through motor controls. As another example, heated platform 12 can be substituted with a non-heated platform to hold the substrate material 10. As another example, as discussed in relation to FIG. 9, a single dispensing head can be provided, rather than two dispensing heads 18 and 22. The single dispensing head can include a swappable syringe or other containment vessels, alternating between conductive or insulating or other materials, and additive deposition can be done serially by swapping out containment vessels. As a still further example, while FIG. 1 shows a heated platform 12, that cures the dispensed layers by thermal conduction; in alternative embodiments apparatus 50 can incorporate an oven or UV lamp, which cure the dispensed layers via convection heating and UV light, respectfully. Other examples will now occur to those skilled in the art. Such variations, and their combinations and subsets, are within the scope of the disclosure as described and claimed, whether or not expressly described.

The foregoing provides a novel apparatus and method for printing circuitry that can dispense conducting traces, insulating traces, solder paste, silk and other materials onto a substrate material in a manner that allows for convenient prototyping of printed circuit boards.

In the preceding description, for purposes of explanation, numerous details are set forth in order to provide a thorough understanding of the embodiments. However, it will be apparent to one skilled in the art that these specific details are not required. The above-described embodiments are intended to be examples only. Alterations, modifications and variations can be effected to the particular embodiments by those of skill in the art without departing from the scope, which is defined solely by the claims appended hereto.

The invention claimed is:

1. An apparatus for printing circuitry comprising:
a stage;
an attachment mechanism for affixing a printed circuit substrate onto the stage;
a carriage assembly for holding at least one dispensing head configured to express a flowable printed circuit board material onto the printed circuit substrate, wherein the at least one dispensing head includes:
a plunger; and
a piston detachably coupled to the plunger;
wherein the plunger is configured to be moved by the piston in a downward direction when the piston is coupled to the plunger to dispense the flowable printed circuit board material from the at least one dispensing head; and
wherein the plunger is configured to be freely displaced by the flowable printed circuit board material in an upward direction when the piston is detached from the plunger to terminate dispensing and avoid air being introduced into the at least one dispensing head;
a motorized mechanism for moving the dispensing head in relation to the printed circuit substrate; and,
a control circuit for receiving instructions representing a circuit pattern pathway for the flowable printed circuit board material on the printed circuit substrate and configured to activate the motorized mechanism and the dispensing head according to the instructions.

2. The apparatus of claim 1, wherein the flowable printed circuit board material is a conductive polymer thick film paste comprising about 30% to about 98% metallic particles; wherein the metallic particles comprise one or more of Ag, Cu, Al, Au, and Ni.

3. The apparatus of claim 1 wherein the flowable printed circuit board material comprises one or more organic vehicles.

4. The apparatus of claim 1, further comprising a proximity sensor for generating a topographical map of the printed circuit substrate surface.

5. The apparatus of claim 4, wherein the proximity sensor locates areas on the printed circuit substrate allocated for solder paste dispensing.

6. The apparatus of claim 1, further comprising at least two dispensing heads;
wherein each of the dispensing heads express a different type of flowable printed circuit board material.

7. The apparatus of claim 1, wherein the control circuit controls at least one of magnitude and duration of expression of the flowable circuit board material onto the printed circuit substrate.

8. The apparatus of claim 1, wherein the plunger is connected to the control circuit; and
wherein the control circuit controls application, removal or reversal of a downward force of the plunger based on thixotropic and physical properties of the flowable circuit board material.

9. The apparatus of claim 1 wherein the carriage assembly has an attachment mechanism for removably securing the dispensing head to the carriage assembly.

10. The apparatus of claim 1 wherein said dispensing head is removably attachable to said carriage assembly.

11. The apparatus of claim 10 wherein the dispensing head dispenses solder paste on a traditionally fabricated circuit board.

12. The apparatus of claim 3, wherein the organic vehicles are selected from the group comprising epoxies, phenols, pyrrolidones, Poly(methyl methacrylate), Polyimide and Polyethylene Terephthalate, and any of their chemical derivatives.

13. The apparatus of claim 1, wherein the flowable printed circuit board material is compressed when the plunger is moved in a downward direction by the piston.

14. The apparatus of claim 1, wherein the flowable printed circuit board material expands when the piston is detached from the plunger thereby causing the flowable printed circuit board material to move the plunger in the upward direction.

15. The apparatus of claim 1, wherein the flowable printed circuit board material is at least one of a conductor, an insulator, a solder paste, a solder mask, and a silk screen material.

16. The apparatus of claim 1, wherein the flowable printed circuit board material is thixotropic having a viscosity within the range about 50 KcP to about 200 KcP.

17. The apparatus of claim 1, further comprising a heated platform associated with the stage, wherein the heated platform is configured to generate controllable temperature profiles within a range of temperatures between about 25° C. to about 350° C. at specified holding times.

18. The apparatus of claim 17, wherein the heated platform reflows the flowable printed circuit board material onto the printed circuit substrate.

19. The apparatus of claim 17, wherein the heated platform is provided for, when the flowable printed circuit board material is an insulator or a conductor, curing the flowable printed circuit board material after the flowable printed circuit board material is applied to the printed circuit substrate.

20. The apparatus of claim 17, wherein the heated platform is provided for, when the flowable printed circuit board material is a solder paste, reflow soldering electrical components to a formed circuit board by melting the flowable printed circuit board material.

* * * * *